(12) United States Patent
Yamakawa

(10) Patent No.: US 7,768,357 B2
(45) Date of Patent: Aug. 3, 2010

(54) SURFACE-MOUNT TYPE CRYSTAL OSCILLATOR

(75) Inventor: Tsutomu Yamakawa, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 59 days.

(21) Appl. No.: 12/343,330

(22) Filed: Dec. 23, 2008

(65) Prior Publication Data

US 2009/0167448 A1 Jul. 2, 2009

(30) Foreign Application Priority Data

Dec. 28, 2007 (JP) ............... 2007-339373

(51) Int. Cl.
*H03B 1/00* (2006.01)
(52) U.S. Cl. ................. 331/68; 331/108 C; 331/108 D; 331/158
(58) Field of Classification Search .............. 331/68, 331/108 C, 108 D, 116 R, 158; 310/48, 340, 310/344; 257/48

See application file for complete search history.

(56) References Cited

U.S. PATENT DOCUMENTS

| 5,696,469 A * | 12/1997 | Meany et al. ............ 331/116 R |
| 2005/0269911 A1* | 12/2005 | Usuda ........................ 310/348 |
| 2007/0126316 A1* | 6/2007 | Usuda et al. ................ 310/348 |

FOREIGN PATENT DOCUMENTS

| JP | 9-162643 | 6/1997 |
| JP | 2006-279979 A | 10/2006 |

* cited by examiner

*Primary Examiner*—Joseph Chang
*Assistant Examiner*—Jeffrey Shin
(74) *Attorney, Agent, or Firm*—Knobbe Martens Olson & Bear LLP

(57) ABSTRACT

A surface-mount type crystal oscillator comprises: a crystal blank; an IC chip on which at least an oscillation circuit using the crystal blank is integrated; a container that accommodates the crystal blank and the IC chip; a pair of inspection terminals provided on an outer surface of the container and electrically connected to the crystal blank, and used for inspecting characteristics of the crystal blank; a communication terminal provided on the outer surface of the container; and first switching means for switchably and electrically connecting and disconnecting the inspection terminals to and from the crystal blank in accordance with a selecting signal supplied from the communication terminal.

9 Claims, 5 Drawing Sheets

SURFACE-MOUNT TYPE CRYSTAL OSCILLATOR

BACKGROUND OF THE INVENTION

1. Field of the Invention

The present invention relates to a quartz crystal oscillator for surface mounting, and more specifically to a crystal oscillator having an inspection terminal, which is used for inspecting the characteristics of a quartz crystal blank, on the outer surface of the container body.

2. Description of the Related Arts

A surface-mount type quartz crystal oscillator wherein a quartz crystal blank and an IC (integrated circuit) chip equipped with an oscillation circuit using the crystal blank are accommodated in a container body for surface mounting is widely built in portable electronic devices represented by mobile phones as a reference source for frequency and time because of small size and light weight thereof. Examples of such surface-mount type crystal oscillators include a crystal oscillator wherein a container body having a recess formed on one of principal surfaces is used, and an IC chip and a crystal blank are encapsulated in the recess; and a crystal oscillator wherein a container body having recesses formed on both of the principal surfaces is used, and a crystal blank is encapsulated in one of the recesses and an IC chip is accommodated in the other recess.

FIG. 1A is a sectional view showing an example of the configuration of a conventional surface-mount type crystal oscillator; and FIG. 1B is a schematic diagram showing the disposition and wire connection of each circuit and each terminal in the crystal oscillator shown in FIG. 1A.

The illustrated crystal oscillator uses container body 1 having a recess; wherein IC chip 2 and crystal blank 3 are accommodated in the recess, and container body 1 is covered with metal cover 4 to close the recess, and thereby IC chip 2 and crystal blank 3 are hermetically encapsulated in container body 1.

Container body 1 has a flat and substantially rectangular parallelepiped shape, and in one of the principal surfaces, a substantially rectangular recess for accommodating IC chip 2 and crystal blank 3 is formed. Such container body 1 is composed of laminated ceramics having a substantially rectangular flat bottom-wall layer, and a frame-wall layer having an opening in the center portion provided on the bottom-wall layer. The inner side wall of the recess is defined by the frame-wall layer, and the upper surface of the bottom-wall layer exposed by the opening of the frame-wall layer becomes the inner bottom surface of the recess. A step portion is formed on the inner wall of the recess, and a pair of holding terminals 5 for holding crystal blank 3 is provided on the upper surface of the step portion. A plurality of circuit terminals used for electrical connection to IC chip 2 are provided on the inner bottom surface of the recess. Mounting terminals 6 used when the crystal oscillator is surface-mounted on a wiring board are provided on the four corner portions of the outer bottom surface of container body 1. Mounting terminals 6 include: a power supply terminal (Vcc); an output terminal (OUT); a grounding terminal (GND); and an AFC (automatic frequency control) terminal to which an AFC signal is supplied. Mounting terminals 6 are electrically connected to corresponding circuit terminals via conducting paths formed in container body 1. Inspection terminals 6A(X1), 6A(X2) are provided on a pair of opposite outer side surfaces of container body 1, respectively. As described below, inspection terminals 6A are electrically connected directly to crystal blank 3, and are used for inspecting the characteristics of crystal blank 3 as a quartz crystal element. All of the circuit terminals, holding terminals 5, mounting terminals 6 and inspection terminals 6A are provided as electrode layers formed on the surface of the laminated ceramics.

A pair of holding terminals 5 are electrically connected to a pair of corresponding terminals in the circuit terminals via conducting paths formed in container body 1, and also electrically connected to a pair of inspection terminals 6A.

IC chip 2 is formed by integrating electronic circuits that constitute oscillation circuit 15 using crystal blank 3. Such a crystal oscillator is constituted as a voltage-controlled crystal oscillator (VCXO), a temperature compensated crystal oscillator (TCXO), a clock oscillator or the like, functional circuits corresponding to these uses are also integrated in IC chip 2. In IC chip 2, since electronic circuits are formed on one of principal surfaces of a semiconductor substrate by an ordinary semiconductor device fabricating process, the principal surface of the semiconductor substrate, on which these electronic circuits are formed, will be referred to as the "circuit forming surface" of the IC chip. On the circuit forming surface, a plurality of IC terminals 7 for connecting IC chip 2 to exterior circuits are provided corresponding to the locations of circuit terminals in container body 1. IC terminals 7 include: a power supply terminal (Vcc); an output terminal (OUT); a grounding terminal (GND); and an AFC terminal; and also include a pair of crystal IC terminals (X1, X2) used for electrical connection with crystal blank 3. IC chip 2 is fixed in the recess of container body 1 so that the circuit forming surface faces the inner bottom surface of the recess using a flip-chip bonding technique. Specifically, IC chip 2 is fixed in the inner bottom surface of the recess by electrically and mechanically connecting IC terminals 7 to the circuit terminals by ultrasonic thermal compression bonding using bumps.

By thus fixing IC chip 2 in the container body 1, crystal IC terminals 7(X1), 7(X2) are electrically connected to the holding terminals 5 via circuit terminals and conducting paths; and the power supply terminal (Vcc), the output terminal (OUT), the grounding terminal (GND), and the AFC terminal among IC terminals 7 are electrically connected to the corresponding ones among mounting terminals 6, respectively.

When the crystal oscillator has a stand-by function, in mounting terminals 6 and IC terminals 7, a stand-by terminal is provided in place of the AFC terminal.

When the crystal oscillator is constituted as a temperature compensated crystal oscillator, a read/write terminal (communication terminal) for reading and writing data from and to a temperature compensating mechanism in IC chip 2 is provided, for example, on the outer side surface of container body 1, and a circuit terminal electrically connected to the read/write terminal is also provided. An IC terminal connected to the temperature compensating mechanism is provided also in IC chip 2, so that temperature compensating data can be read from and written in the temperature compensating mechanism from the read/write terminal via the circuit terminal.

As shown in FIG. 2, crystal blank 3 is, for example, a substantially rectangular AT-cut quartz crystal blank, and excitation electrodes 9a are formed on the both principal surfaces, respectively. Lead-out electrodes 9b are extended from excitation electrodes 9a toward the both sides of one end portion of crystal blank 3, respectively. Each of lead-out electrodes 9b is formed so as to turn back between the both principal surfaces of crystal blank 3 at the location on the end edge portion of crystal blank 3. Crystal blank 3 is held in the recess of container body 1 at the location where a pair of lead-out electrodes 9b are drawn out by fixing these lead-out electrodes 9b to holding electrode 5 with electrically conducting adhesive 10, and electrically thus connected to IC chip 2. At this time, crystal blank 3 is directly electrically connected to inspection terminals 6A(X1), 6(X2).

Such a crystal oscillator can be assembled by fixing IC chip 2 on the inner bottom surface of the recess in container body 1, fixing crystal blank 3 on the step portion of the recess, and thereafter bonding metal cover 4 to the open end of the recess to close the recess by, for example, seam welding. Next, the vibration characteristics, such as crystal impedance (C1), of crystal blank 3 as crystal unit 3A are inspected using inspection terminals 6A(X1), 6A(X2). As a result of the inspection, crystal oscillators having favorable vibration characteristics and satisfying standards for a crystal unit are made to be acceptable products.

When metal cover 4 is bonded to container body 1 using seam welding or the like, stress due to difference in the coefficients of thermal expansion between metal cover 4 and container body 1 is generated, strain occurs in container body 1 by the stress, electrically conducting adhesive 10 for fixing crystal blank 3 is also affected by the stress, and the state of the vibration system including crystal blank 3 is also changed. The vibration characteristics of crystal blank 3 may be then changed in the states before and after bonding metal cover 4. Therefore, when requirements of stability and reliability of a crystal oscillator are high, the inspection for the characteristics of crystal blank 3 after metal cover 4 has been bonded to container body 1 to encapsulate IC chip 2 and crystal blank 3 in container body 1 becomes essential. In addition, since vibration characteristics such as C1 change due to the state of fixing crystal blank 3 by electrically conducting adhesive 10, inspection terminals 6A(X1), 6A(X2) can also be used for measuring the vibration characteristics before encapsulated by metal cover 4.

However, since inspection terminals 6A(X1), 6A(X2) used for inspecting the characteristics of crystal blank 3 as crystal unit 3A are exposed to the outer side surface of container body 1, the surface-mount type crystal oscillator having the above configuration is prone to be affected by other electronic devices and wiring patterns on the wiring board when the crystal oscillator is mounted on the wiring board. In particular, since inspection terminals 6A(X1), 6A(X2) are always electrically connected to crystal blank 3, the stray capacitance of the circuit containing crystal blank 3 is increased, and the deterioration of oscillation characteristics, such as the variation of oscillation frequencies, is caused.

Inspection terminals 6A(X1), 6A(X2) are electrically connected not only to crystal blank 3 but also to IC chip 2. Therefore, when the vibration characteristics of crystal blank 3 is measured, inspection terminals 6A(X1), 6A(X2) are subjected to the electrical effects of IC chip 2 wherein oscillation circuit 15 is integrated, and the vibration characteristics of crystal blank 3 alone cannot be strictly measured.

Furthermore, in crystal unit 3A constituted by hermetically encapsulating crystal blank 3 in a container, so-called DLD (drive level dependency) characteristics deteriorate due to, for example, dust adhered on excitation electrode 9a or lead-out electrode 9b. Therefore, it is a general practice to make crystal blank 3 strongly excited via inspection terminals 6A(X1), 6A(X2) to shake dust adhered on excitation electrode 9a or lead-out electrode 9b down. In this case, since inspection terminals 6A(X1), 6A(X2) are also electrically connected to IC chip 2, there is a problem that electronic circuits in IC chip 2 are damaged by voltage used for strongly exciting crystal blank 3.

As a method for solving such a problem, a method wherein the conducting path that connects inspection terminals to the IC chip is drawn out to the outer side surface of the container body and disconnected, and after measuring the vibration characteristics of the crystal blank, the disconnected conducting path is connected by electrically conducting adhesive or the like to complete the crystal oscillator, is proposed in, for example, Japanese Patent Application Laid-Open No. 2006-279979 (JP-2006-279979A). However, this method has a problem that the crystal oscillator tends to cause defective appearance wherein the electrically conducting adhesive mounded from the outer side surface thereof, and the manufacturing process is complicated to lower productivity.

Similarly, Japanese Patent Application Laid-Open No. 9-162643 (JP-9-162643A) discloses an oscillator module including a pair of external terminals connected to a crystal blank and a plurality of external terminals connected to an oscillation circuit, which can independently measure the characteristics of the crystal blank and the characteristics of the oscillation circuit, and can be constituted as a crystal oscillator by electrical connection between the external terminals.

SUMMARY OF THE INVENTION

It is an object of the present invention to provide a surface-mount type crystal oscillator that can prevent change in vibration characteristics caused by an inspection terminal for inspecting the characteristics of a crystal blank, and has improved productivity.

The object of the present invention can be achieved by a surface-mount type crystal oscillator which comprises: a crystal blank; an IC chip on which at least an oscillation circuit using the crystal blank is integrated; a container that accommodates the crystal blank and the IC chip; a pair of inspection terminals provided on an outer surface of the container and electrically connected to the crystal blank, and used for inspecting characteristics of the crystal blank; a communication terminal provided on the outer surface of the container; and first switching means for switchably and electrically connecting and disconnecting the inspection terminals to and from the crystal blank in accordance with a selecting signal supplied from the communication terminal.

According to such a configuration, the electrical connection between a crystal blank and inspection terminals can be switchably turned on or turned off by the selecting signal supplied from outside. By disconnecting the electrical connection between the crystal blank and the inspection terminals after the vibration characteristics of the crystal blank have been measured using the inspection terminal, electrical effects from a wiring pattern or other electronic parts on a wiring board can be prevented when the crystal oscillator is mounted on the wiring board.

In the crystal oscillator according to the present invention, second switching means may be provided for switchably electrically connecting and disconnecting the crystal blank to and from the oscillator circuit in accordance with the selecting signal. By providing the second switching means, the crystal blank can be electrically isolated from the oscillation circuit when the vibration characteristics of the crystal blank are measured using the inspection terminals, and the vibration characteristics of the crystal blank can be independently measured without being electrically affected by the IC chip. In addition, when the crystal blank is made to be strongly excited to improve DLD characteristics, the application of high voltage to the oscillation circuit and the like can be prevented, and the electrical damage of the IC chip can be prevented.

DETAILED DESCRIPTION OF THE PREFERRED EMBODIMENTS

Figure 1A:
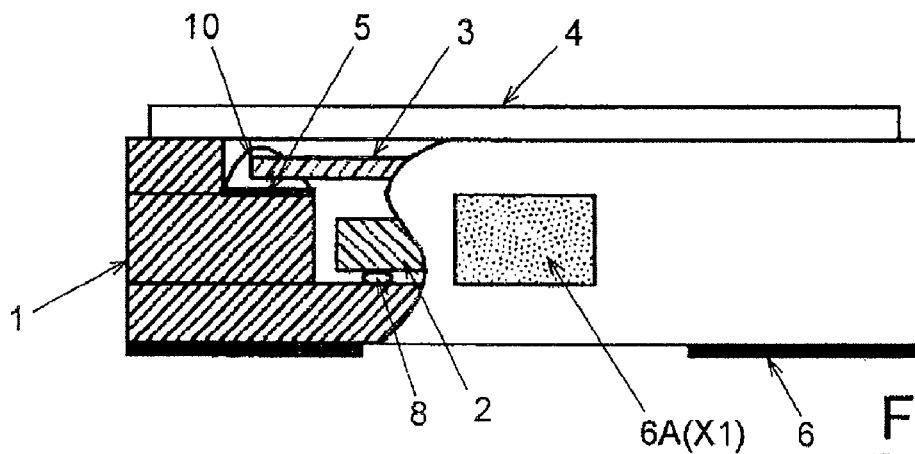
FIG. 1A is a sectional view showing an example of the configuration of a conventional surface-mount type crystal oscillator.
Figure 1B:
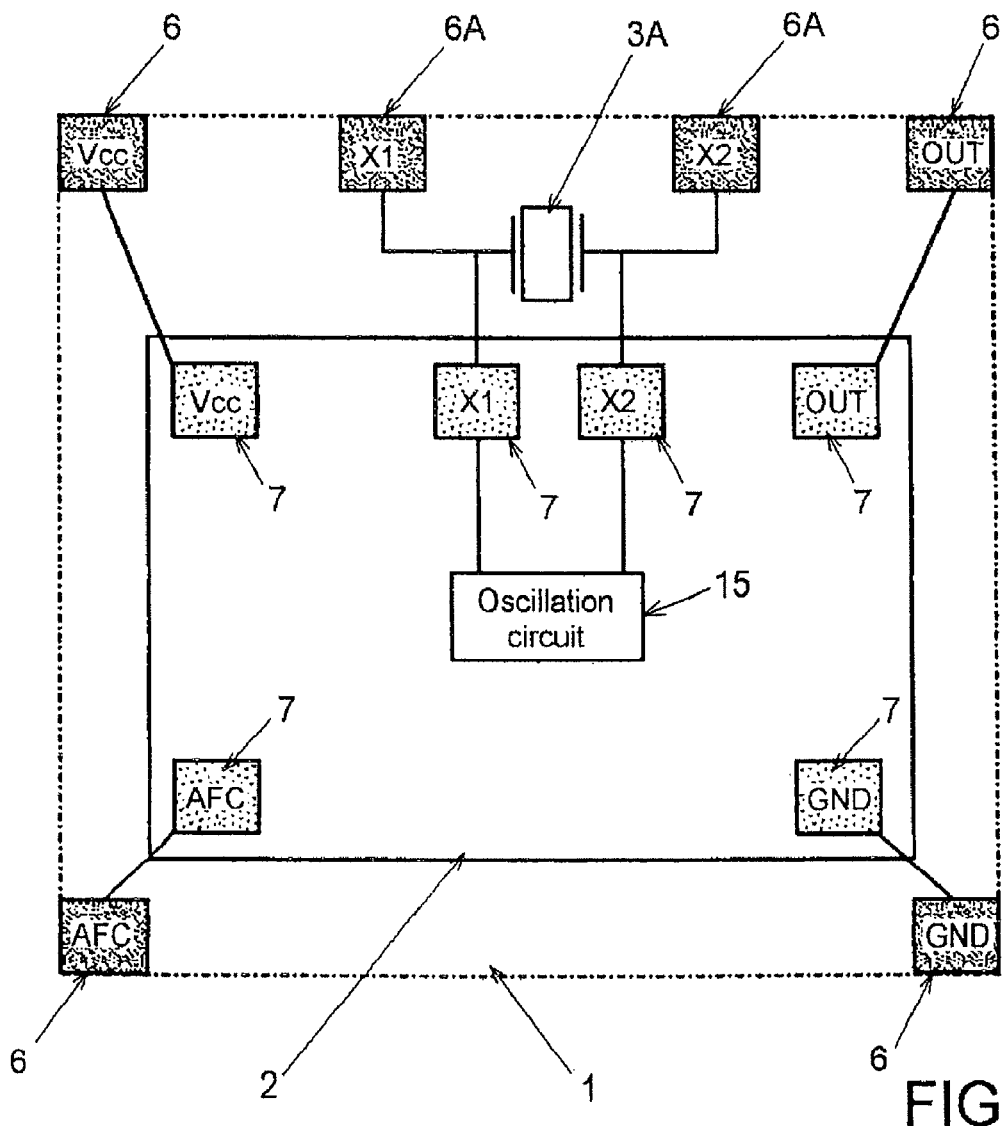
FIG. 1B is a schematic diagram showing the disposition and wire connection of each circuit and each terminal in the crystal oscillator shown in FIG. 1A.
Figure 3:
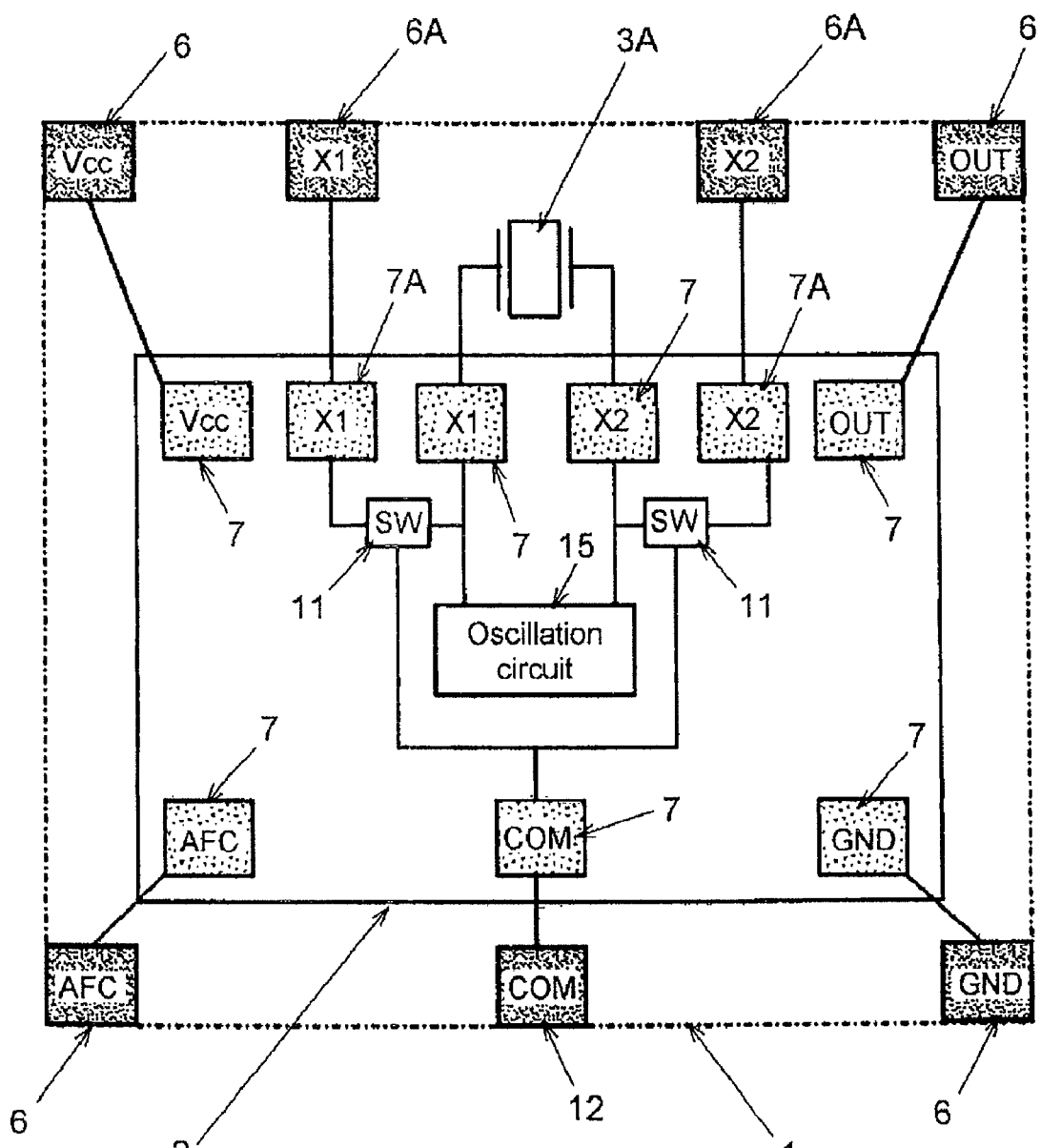
FIG. 3 is a schematic diagram showing the disposition and wire connection of each circuit and each terminal in the surface-mount type crystal oscillator according to the first embodiment of the present invention.

In FIG. 3 showing a surface-mount type crystal oscillator according to the first embodiment of the present invention, the same reference numerals are given to the components identical to those shown in FIGS. 1A and 1B, and the repeated description thereof will be omitted or simplified. Although the crystal oscillator according to the first embodiment is similar to the crystal oscillator shown in FIGS. 1A and 1B, it is different from the one shown in FIGS. 1A and 1B in that the internal circuit configuration of IC chip 2 is different, and that the container body is further provided with terminals corresponding to the difference in the circuit configuration of the IC chip 2. FIG. 3 schematically shows the disposition and wire connection of each circuit and each terminal in the surface-mount type crystal oscillator according to the first embodiment.

Figure 2:
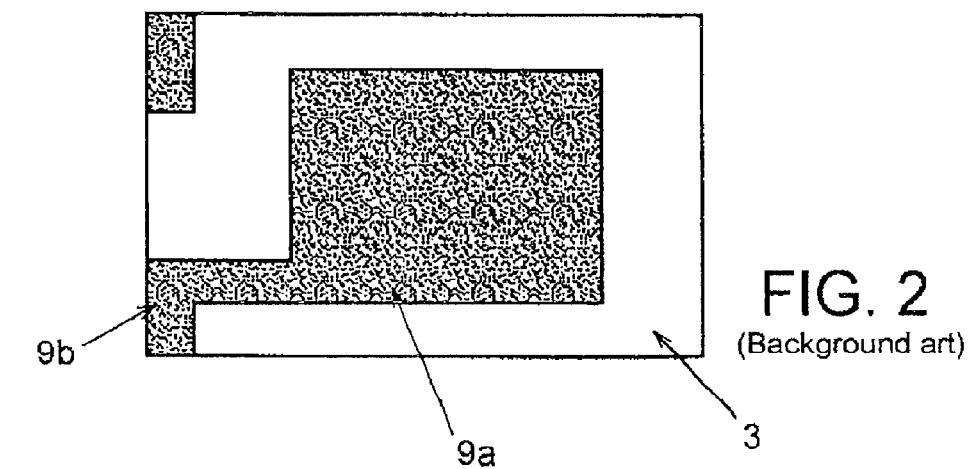
FIG. 2 is a plan view showing an example of the configuration of a crystal blank.

As described above, in the crystal oscillator according to the first embodiment, a container body 1 having a recess is used, IC chip 2 is fixed on the inner bottom surface of the recess using ultrasonic thermo-compression as a flip-chip bonding technique, crystal blank 3 is fixed on the upper surface of the step portion formed in the inner side wall of the recess, and the recess is closed by metal cover 4. IC chip 2 and crystal blank 3 are encapsulated in the recess. As crystal blank 3, what is shown in FIG. 2 can be used. As shown in FIG. 1A, crystal blank 3 is held in the recess by fixing both sides of an end of crystal blank 3 to which lead-out electrodes 9b are extended to a pair of holding electrodes 5 formed on the upper surface of the step portion of the recess using electrically conducting adhesive 10. On the outer side surface of container body 1, a pair of inspection terminals 6A(X1), 6A(X2) used for inspecting the characteristics crystal blank 3 are provided.

IC chip 2 is further provided with IC terminal 7(COM) for controlling and two IC terminals 7A(X1), 7A(X2), in addition to six IC terminals 7 shown in FIG. 1B. On the inner bottom surface of container body 1, circuit terminals are formed corresponding to these IC terminals 7, 7A. In IC chip 2, crystal IC terminals 7(X1), 7(X2) are used for electrical connection of the oscillator circuit and crystal blank 3; and are electrically connected to holding terminals 5 of container body 1, and IC terminals 7A(X1), 7(X2) are electrically connected to inspection terminals 6A(X1), 6A(X2). In the following description, IC terminals 7A(X1), 7A(X2) are referred to as "inspection IC terminals." Furthermore, inside IC chip 2, electronic switch (SW) 11 that switchably connects inspection IC terminals 7A(X1), 7A(X2) to crystal IC terminals 7(X1), 7(X2) is provided. Electronic switch 11 is composed of, for example, an analog switch, and is in ON state (conductive state) or OFF state (disconnected state) corresponding to a selecting signal from outside. The selecting signal is a binary signal of, for example, "1" or "0", or "HIGH" or "LOW", and is given to electronic switch 11 via controlling IC terminal 7(COM). In the following description, it is assumed that when the selecting signal is "1", electronic switch 11 is in conductive state and when the selecting signal is "0", electronic switch 11 is in disconnected state. Controlling IC terminal 7(COM) is electrically connected to communication terminal 12(COM) provided on the outer side surface of container body 1 via the circuit terminal and the selecting signal is supplied form communication terminal 12 to IC chip 2.

In the crystal oscillator according to the first embodiment, after IC chip 2 and crystal blank 3 are accommodated in the recess of container body 1, and covered with metal cover 4 to hermetically encapsulate IC chip 2 and crystal blank 3 in the recess, first, signal "1" is supplied to communication terminal 12(COM), and inspection IC terminals 7A(X1), 7A(X2) are electrically connected to crystal IC terminals 7(X1), 7(X2) using electronic switch 11. In this state, the vibration characteristics of crystal blank 3 as crystal unit 3A are measured using inspection terminals 6A provided in container body 1. Thereafter, signal "0" is supplied to communication terminal 12(COM) to disconnect electronic switch 11, and inspection IC terminals 7A(X1), 7A(X2) are electrically isolated from crystal IC terminals 7(X1), 7(X2). Even in this state, crystal blank 3 is still electrically connected to crystal IC terminals 7(X1), 7(X2).

Thereby, after the vibration characteristics of crystal blank 3 is measured and inspected, inspection terminals 6(X1), 6(X2) are electrically isolated from crystal IC terminals 7(X1), 7(X2). Inspection terminals 6(X1), 6(X2) are thus electrically isolated from both of crystal blank 3 and oscillation circuit 15 in IC chip 2. Even if the crystal oscillator is mounted on a wiring board, the oscillation circuit including crystal blank 3 (crystal unit 3A) is not subjected to electrical effects from wiring patterns or other electronic parts on the wiring board. According to the crystal oscillator of this embodiment, the vibration characteristics of crystal blank 3 are favorably maintained, the oscillation frequency is stable, and favorable oscillation characteristics are exhibited.

Figure 4:
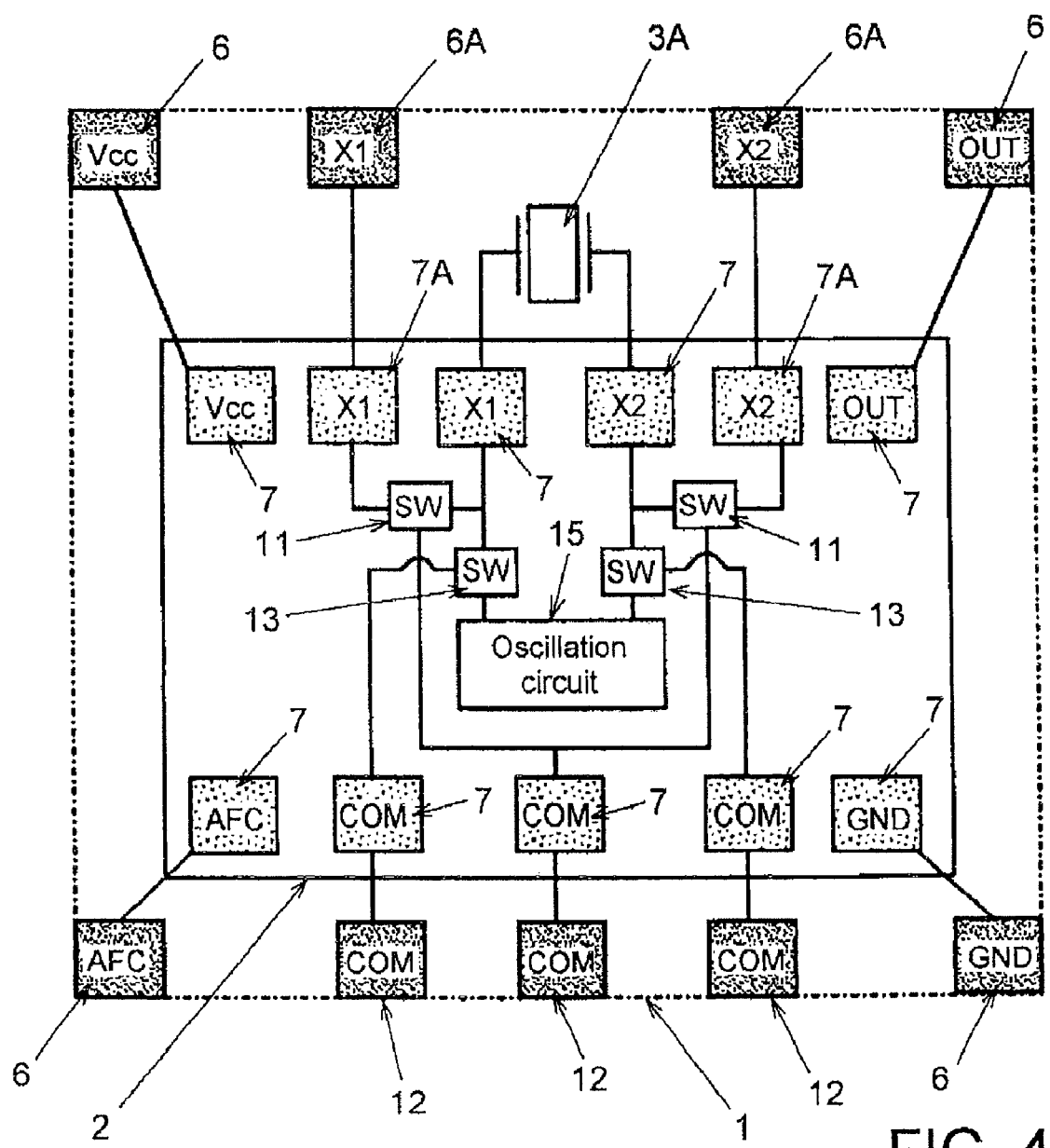
FIG. 4 is a schematic diagram showing the disposition and wire connection of each circuit and each terminal in the surface mount type crystal oscillator according to the second embodiment of the present invention.

Next, a crystal oscillator according to the second embodiment of the present invention will be described referring to FIG. 4. In FIG. 4, the same reference numerals are given to the components same as those shown in FIG. 3.

The crystal oscillator according to the second embodiment is a crystal oscillator wherein electronic switch (SW) 13 and inverter 14 are further provided in IC chip 2 in the crystal oscillator according to the first embodiment. Electronic switch 13 is provided between crystal IC terminals 7(X1), 7(X2) and oscillation circuit 15, and switchably connects crystal IC terminals 7(X1), 7(X2) to oscillation circuit 15. To electronic switch 13, the selecting signal whose logic is inverted by inverter 14 are supplied. Therefore, in the crystal oscillator, when the selecting signal supplied to communication terminal 12(COM) is "1", electronic switch 11 is conductive and electronic switch 13 is disconnected. When the supplied selecting signal is "0", electronic switch 11 is disconnected, and electronic switch 13 becomes conductive.

In the crystal oscillator according to the second embodiment, after IC chip 2 and crystal blank 3 are housed in the recess of container body 1, first, signal "1" is supplied to communication terminal 12(COM) to electrically connect inspection IC terminals 7A(X1), 7(X2) to crystal IC terminals 7(X1), 7(X2), and to disconnect crystal IC terminals 7(X1), 7(X2) from oscillation circuit 15. At this time, crystal blank 3 is still electrically connected to crystal IC terminals 7(X1), 7(X2). In this state, to improve DLD characteristics described above, an external oscillation circuit is connected to inspection terminals 6A(X1), 6A(X2) to make crystal blank 3 strongly excited. In the second embodiment, since oscillation circuit 15 in IC chip 2 is isolated from both crystal blank 3 and inspection terminals 6A(X1), 6A(X2), no electrical damage occurs in IC chip 2.

Next, after covering container body 1 with metal cover 4 to hermetically encapsulate IC chip 2 and crystal blank 3, the characteristics of crystal blank 3 as crystal unit 3A are inspected. In the inspection, the selecting signal of "1" is supplied to communication terminal 12(COM) to electrically connect inspection terminals 6A(X1), 6A(X2) to crystal blank 3 via inspection IC terminals 7A(X1), 7A(X2) and crystal IC terminals 7(X1), 7(X2). At this time, since electronic switch 13 is in disconnected state, vibration characteristics can be measured in the state wherein crystal blank 3 is isolated from oscillation circuit 15; therefore, the vibration characteristics of crystal blank 3 alone can be inspected without being electrically affected by oscillation circuit 15.

When the inspection for characteristics has been completed, the selecting signal of "0" is supplied to communication terminal 12(COM). Thereby, inspection IC terminals 7A(X1), 7A(X2) are electrically isolated from crystal IC terminals 7(X1), 7(X2), crystal IC terminals 7(X1), 7(X2) are electrically connected to oscillation circuit 15, and oscillation circuit 15 is electrically connected to crystal blank 3. Even if the crystal oscillator is mounted on a wiring board, in the same manner as in the first embodiment, the oscillation circuit including crystal blank 3 (crystal unit 3A) is prevented from the electrical effect from the wiring pattern or other electronic parts on the wiring board.

Figure 5:
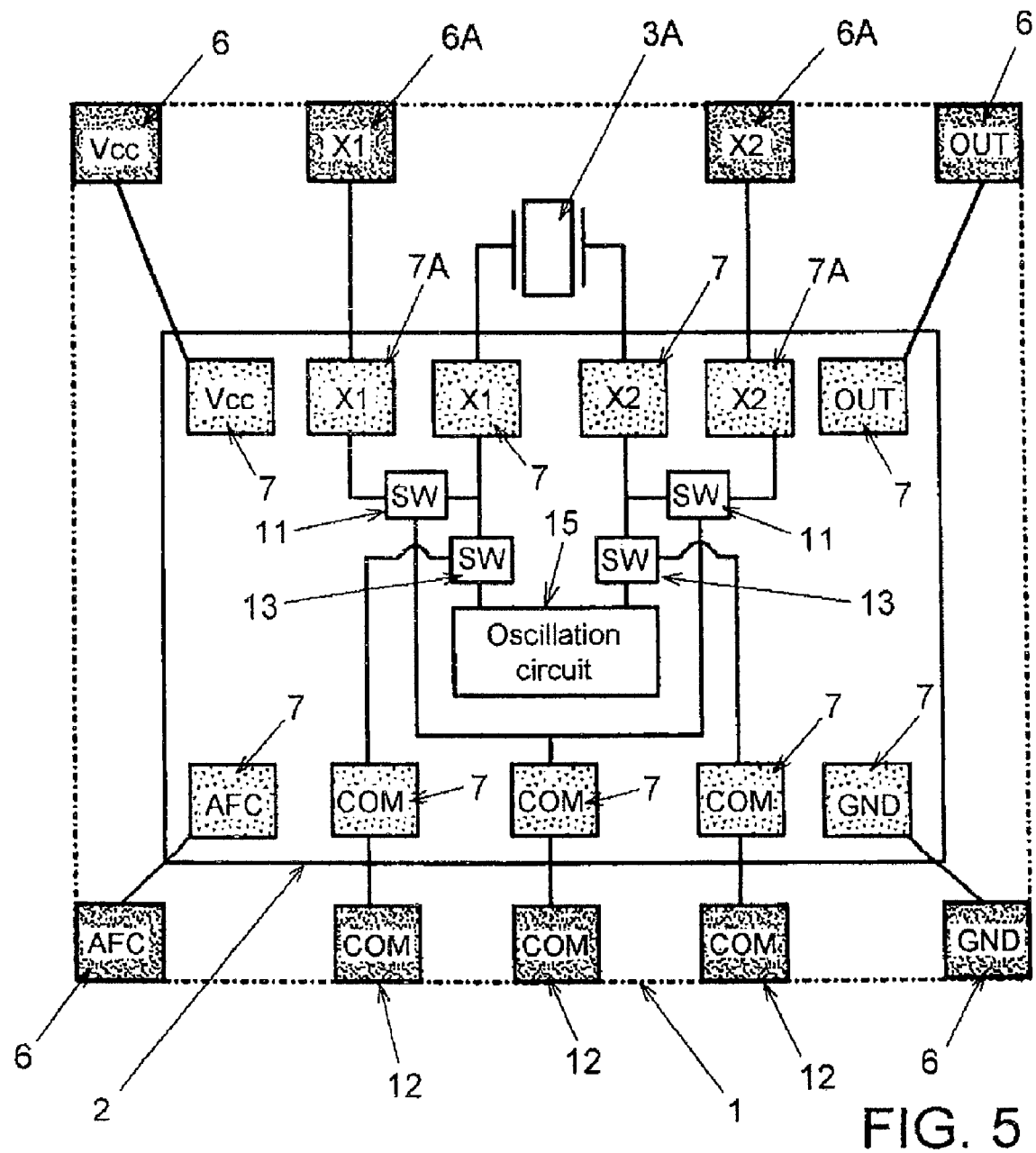
FIG. 5 is a schematic diagram showing the disposition and wire connection of each circuit and each terminal in the surface-mount type crystal oscillator according to the third embodiment of the present invention.

Next, a crystal oscillator according to the third embodiment of the present invention will be described referring to FIG. 5. In FIG. 5, the same reference numerals are given to the same components as those in FIGS. 3 and 4.

The crystal oscillator according to the third embodiment is a crystal oscillator same as the crystal oscillator according to the second embodiment from which inverters 14 in IC chip 2 are removed. Instead, IC chip 2 is further provided with control IC terminal 7(COM) for each electronic switch 13. Control IC terminals 7(COM) are used for supplying selecting signals to corresponding electronic switches 13. Corresponding to these newly provided IC terminals 7(COM) for controlling, separate communication terminals 12(COM) are provided in container body 1. Specifically, in the crystal oscillator, by suitably selecting the selecting signals supplied to electronic switches 11, 13 respectively, the conducting states of electronic switches 11, 13 can be independently controlled.

In the crystal oscillator, in the same manner as the case of the second embodiment, by applying suitable selecting signals, crystal blank 3 can be strongly excited in the state electrically isolated from oscillation circuit 15, the DLD characteristics can be improved, and the vibration characteristics of crystal blank 3 can be independently measured in the state not affected by oscillation circuit 15. Thereby, the crystal oscillator can be mounted on the wiring board in the state where crystal IC terminals 7(X1), 7(X2) and inspection IC terminals 7A(X1), 7A(X2) are electrically isolated.

Furthermore, in the crystal oscillator according to the third embodiment, by making both electronic switches 11, 13 in the conductive state, the vibration characteristics of crystal blank 3 as crystal unit 3A can be measured in the state where oscillation circuit 15 is connected to crystal blank 3. Since the vibration characteristics of crystal blank 3 can be measured in both the state where crystal blank 3 is isolated from oscillation circuit 15 and the state where crystal blank 3 is electrically connected to oscillation circuit 15, and the results of these measurements can be compared, the crystal oscillator according to the third embodiment is convenient in defect analysis for crystal oscillators.

Figure 6:
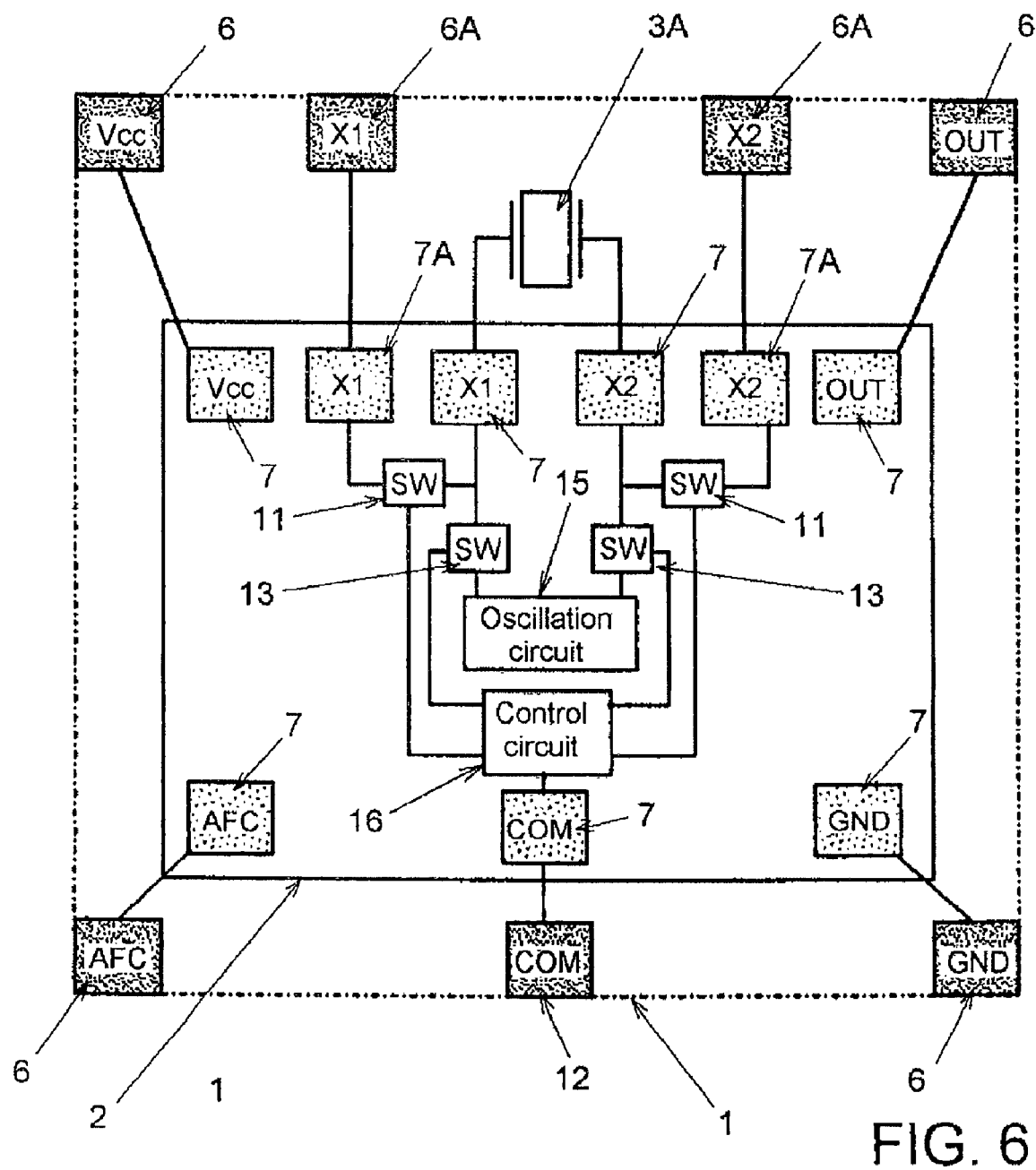
FIG. 6 is a schematic diagram showing the disposition and wire connection of each circuit and each terminal in the surface-mount type crystal oscillator according to the fourth embodiment of the present invention.

Next, a crystal oscillator according to the fourth embodiment of the present invention will be described referring to FIG. 6. In FIG. 6, the same reference numerals are given to the same components as those in FIG. 5.

In the third embodiment, a plurality of IC terminals 7(COM) for controlling are provided to independently control the conduction of electronic switches 11, 13, and correspondingly, a plurality of communication terminals 12 are provided in container body 1 for each of electronic switches 11, 13. However, by such a configuration, since the number of communication terminals 12 provided in container body 1 is increased, the miniaturization of the crystal oscillator is hindered.

Therefore, in the crystal oscillator according to the fourth embodiment, the number of communication terminals 12(COM) is decreased and at the same time, the number of control IC terminals 7(COM) provided in IC chip 2 is decreased, and instead, control circuit 16 is provided between control IC terminal 7(COM) and electronic switches 11, 13. In the illustrated example, the number of communication terminals 12(COM) is 1. An encoded digital controlling signal is supplied from communication terminal 12(COM) to control circuit 16 of IC chip 2. The digital controlling signal is, for example, a signal that can arbitrarily set up the conduction and disconnection of electronic switches 11, 13. Control circuit 16 decodes the digital controlling signal, and supplies selecting signals to each of electronic switches 11, 13 corresponding to the results of decoding. According to such a configuration, the number of communication terminals 12 provided on the outer side surface of container body 1 can be minimized to, for example, 1, and thereby, the surface-mount type crystal oscillator can be miniaturized. The configuration wherein a control circuit is provided to decode the digital controlling signal in the control circuit and control each electronic switch, can also be applied to the above-described first and second embodiments.

Although preferred embodiments of the present invention have been described above for the case when an IC chip and a crystal blank are accommodated in the recess provided in one of principal surfaces of a container body, the crystal oscillator to which the present invention is applied is not limited to the crystal oscillator having such a structure. For example, the present invention can also be applied to a crystal oscillator having a configuration wherein a container body with recesses formed respectively on both of the principal surfaces is used, a crystal blank is encapsulated in one recess and an IC chip is accommodated in the other recess. Furthermore, other than oscillation circuit 15, functional circuits corresponding to the use may also be integrated in IC chip 2.

What is claimed is:

1. A surface-mount type crystal oscillator, comprising:
a crystal blank;
an IC chip on which at least an oscillation circuit using the crystal blank is integrated;
a container that accommodates the crystal blank and the IC chip,
a pair of inspection terminals provided on an outer surface of the container and electrically connected to the crystal blank, and used for inspecting characteristics of the crystal blank;
a communication terminal provided on the outer surface of the container; and
first switching means for switchably and electrically connecting and disconnecting the inspection terminals to and from the crystal blank in accordance with a selecting signal supplied from the communication terminal.

2. The crystal oscillator according to claim 1, wherein the IC chip comprises a first terminal used for connecting to the inspection terminal, and a second terminal used for connecting to the crystal blank, and the first switching means is an electronic switch provided in the IC chip.

3. The crystal oscillator according to claim 1, further comprising second switching means for switchably and electrically connecting and disconnecting the crystal blank to and from the oscillator circuit in accordance with the selecting signal.

4. The crystal oscillator according to claim 3, wherein the selecting signal is supplied to the first and second switching means, so that the second switching means is in a disconnected state when the first switching means is in a conductive state, and the second switching means is in a conductive state when the first switching means is in a disconnected state.

5. The crystal oscillator according to claim 3, wherein the IC chip comprises a first terminal used for connecting to the inspection terminal and a second terminal used for connecting to the crystal blank, and each of the first and second switching means is an electronic switch provided in the IC chip.

6. The crystal oscillator according to claim 5, further comprising an inverter that inverts a selecting signal supplied to the first switching means to produce a selecting signal supplied to the second switching means.

7. The crystal oscillator according to claim 3, wherein the selecting signal is an encoded digital signal, and
the crystal oscillator further comprises a control circuit provided in the IC chip, to decode the digital signal and control the first and second switch means in accordance with results of the decoding.

8. The crystal oscillator according to claim 1, wherein the inspection terminals and the communication terminal are provided on an outer side surface of the container.

9. The crystal oscillator according to claim 7, wherein the inspection terminal and the communication terminal are provided on an outer side surface of the container.

* * * * *